United States Patent [19]

Temple

[11] Patent Number: 4,816,892
[45] Date of Patent: Mar. 28, 1989

[54] SEMICONDUCTOR DEVICE HAVING TURN-ON AND TURN-OFF CAPABILITIES

[75] Inventor: Victor A. K. Temple, Clifton Park, N.Y.

[73] Assignee: General Electric Company, Schenectady, N.Y.

[21] Appl. No.: 36,058

[22] Filed: Apr. 9, 1987

Related U.S. Application Data

[63] Continuation of Ser. No. 766,165, Aug. 15, 1985, abandoned, which is a continuation of Ser. No. 345,290, Feb. 3, 1982, abandoned.

[51] Int. Cl.[4] .............................................. H01L 29/74
[52] U.S. Cl. ...................... 357/38; 357/23.4; 357/39; 357/43; 357/86
[58] Field of Search ............... 357/20, 23.4, 38, 43, 357/39, 86

[56] References Cited

U.S. PATENT DOCUMENTS 4,170,020 10/1979 Sueoka et al. .................. 357/38

FOREIGN PATENT DOCUMENTS

| 39941 | 11/1981 | European Pat. Off. | 357/38 T |
| 2040657 | 2/1972 | Fed. Rep. of Germany | 357/39 T |
| 28797 | 5/1981 | Fed. Rep. of Germany | 357/38 T |

OTHER PUBLICATIONS

S. Sun et al., "Modeling On-Resistance . . . Trans.", IEEE Trans. On Elec. Dev., vol. ED-27, No. 2, Feb. 1980, pp. 356-367.
R. Love et al., "Large Area Power Mosfet . . . ", Proc, IEDM, 1981, Dec. 1981, pp. 418-420.
J. Plummer et al., "I-G Planar Thyrs:I & II", IEEE Trans. On Elec. Dev., vol. ED-27, #2, Feb. 1980, pp. 380-393.

Primary Examiner—Joseph E. Clawson, Jr.
Attorney, Agent, or Firm—Robert Ochis; James C. Davis, Jr.; Marvin Snyder

[57] ABSTRACT

A semiconductor device comprises four regions of alternating conductivity type and comprises a plurality of turn-on cells at one of its major surfaces and a plurality of turn-off cells at another of its major surfaces. Both the turn-on and turn-off cells are of the conductor-insulator-semiconductor type. In an embodiment, the cell repeat distance for both turn-on cells and turn-off cells is preferably less than about the minimum thickness of the region of the semiconductor device that supports most of the device voltage. This enables the semiconductor device to operate efficiently in a field-effect transistor mode, in addition to a thyristor mode.

16 Claims, 3 Drawing Sheets

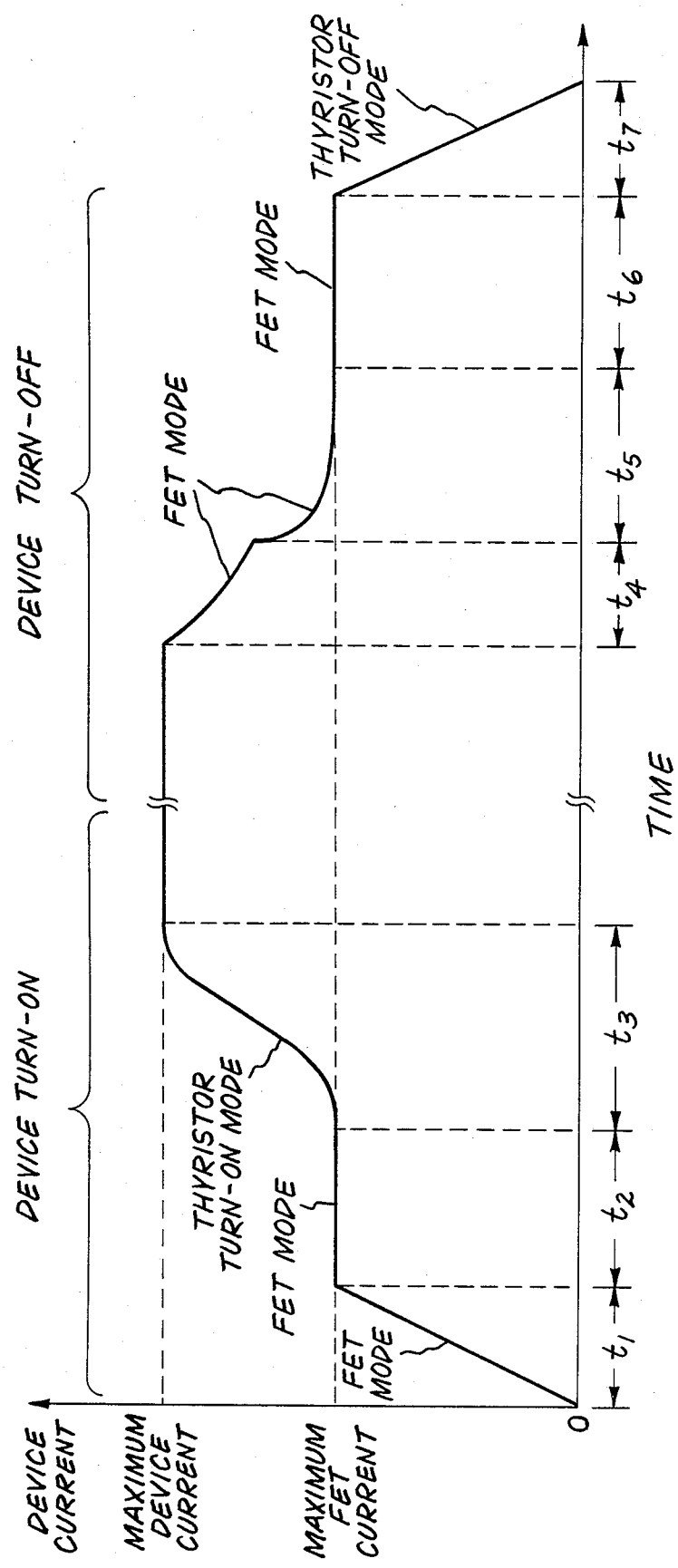

SEMICONDUCTOR DEVICE HAVING TURN-ON AND TURN-OFF CAPABILITIES

CROSS-REFERENCE TO RELATED APPLICATION

This application is a continuation of application Ser. No. 766,165, filed Aug. 15, 1985, which is a continuation of application Ser. No. 345,290, filed Feb. 3, 1982, both abandoned.

The present invention is related to U.S. patent application Ser. No. 707,309 filed Mar. 1, 1985 now abandoned as a continuation of application Ser. No. 391,620 filed June 24, 1982 now abandoned as a continuation in part of application Ser. No. 331,049, by V.A.K. Temple (the present inventor), filed Dec. 16, 1981, which is assigned to the present assignee.

BACKGROUND OF THE INVENTION

The invention relates to thyristors, and, more particularly, to thyristors having both turn-on and turn-off capabilities.

Thyristors are well known semiconductor devices which are typically used as current switches for enabling and interrupting current flow in a circuit. A thyristor is "turned-on" when it provides a high conductance path between two of its terminals (that is, is anode and cathode), and is "turned-off" when it provides a high resistance path between such two terminals. A typical prior art thyristor 10 is shown in FIG. 1. The thyristor 10 incldues four regions, 12, 14, 16 and 18, of alternating conductivity type; an anode 20 and a cathode 22; and a metal-oxide-semiconductor ("MOS") turn-on structure 24; or, more broadly stated, a conductor-insulator-semiconductor turn-on structure 24.

The MOS turn-on structure 24 includes a gate 26 and an insulating layer 28 separating the gate 26 from the semiconductor body of the thyristor 10. The biasing of the gate 26 with a positive voltage (with respect to the cathode 22) exceeding a threshold value "inverts" the portions of the P-type region 16 adjacent to the insulating layer 28, thereby creating inversion channels 30, which can conduct electrons. Accordingly, electrons from the cathode 22 can flow in the electron current paths 32 through the N-type region 18 to the N-type region 14, via the inversion channels 30.

As is known in the art, the thyristor 10 can be modeled as two thyristor structures, comprising an N-P-N transistor structure, formed by N-type region 14, P-type region 16, and N-type region 18, and a P-N-P transistor structure, formed by P-type region 12, N-type region 14, and P-type region 16. The N-P-N and P-N-P transistor structures are regeneratively "coupled" to each other; that is the collector of the N-P-N transistor structure (region 14) is coupled to the base of the P-N-P transistor structure (region 14) and so can drive this base, and the collector of the P-N-P transistor structure (region 16) is coupled to the base of the N-P-N transistor structure (region 16) and so can drive this base. Accordingly, the supply of electrons to the N-type region 14 (the base of the P-N-P transistor structure) causes both the N-P-N and P-N-P transistor structures to regeneratively turn on, whereby the thyristor 10 becomes turned on.

The above-referenced patent application discloses and claims a semiconductor device which operates as a thyristor and which includes MOS turn-off structure at its lower surface (corresponding to the lower surface of the thyristor 10).

It would be desirable to provide a semiconductor device which can operate as a thyristor and which has MOS turn-on structure at its upper surface and MOS turn-off structure at its lower surface. Such a device would have turn-off capabilities and yet be simple to manufacture because each surface of the device would have only two electrodes; that is, a gate for MOS turn-on or turn-off structure and the anode or cathode.

OBJECTS OF THE INVENTION

Accordingly, it is an object of the invention to provide a semiconductor device having MOS turn-on structure on one of its surfaces and MOS turn-off structure at another of its surfaces.

A further object of the invention is to provide a semiconductor device which can operate either as a thyristor or as a field-effect-transistor (hereinafter, "FET"), whereby significant advantages as set forth below result.

SUMMARY OF THE INVENTION

In carrying out the objects of the invention, there is provided a semiconductor device comprising a body of semiconductor material; first and second electrodes; and first and second pluralities of cells.

The semiconductor body includes first, second, third and fourth regions successively joined together. The first and third regions are of one conductivity type, and the second and fourth regions are of the opposite conductivity type. The second region is doped to a predetermined concentration at least in its portion which is adjacent to the third region. The third region is doped substantially higher in concentration than the predetermined doping concentration. The first and fourth regions each include a respective portion doped substantially higher in concentration than the third region doping concentration. The first and second electrodes are electrically connected, respectively, to the first and fourth regions.

Each of the first plurality of cells comprises conductor-insulating-semiconductor-type means for transporting majority carriers between the second region and the first electrode. Each of the second plurality of cells comprises conductor-insulator-semiconductor-type means for transporting majority carriers between the fourth region and the second region.

In a particular embodiment of the invention, the cell repeat distances of the first and second pluralities of cells are less than about the minimum thickness of the second region of the semiconductor body.

BRIEF DESCRIPTION OF THE DRAWING FIGURES

The features of the invention believed to be novel are set forth with particularity in the appended claims. The invention itself, together with further objects and advantages thereof, may be best understood by reference to the following description taken in conjunction with the accompanying drawing figures in which:

FIG. 3 is a graph of device current versus time illustrating aspects of turn-on and turn-off of a semiconductor device in a controlled manner in accordance with an embodiment of the invention.

DETAILED DESCRIPTION OF SPECIFIC EMBODIMENTS OF THE INVENTION

Figure 2:
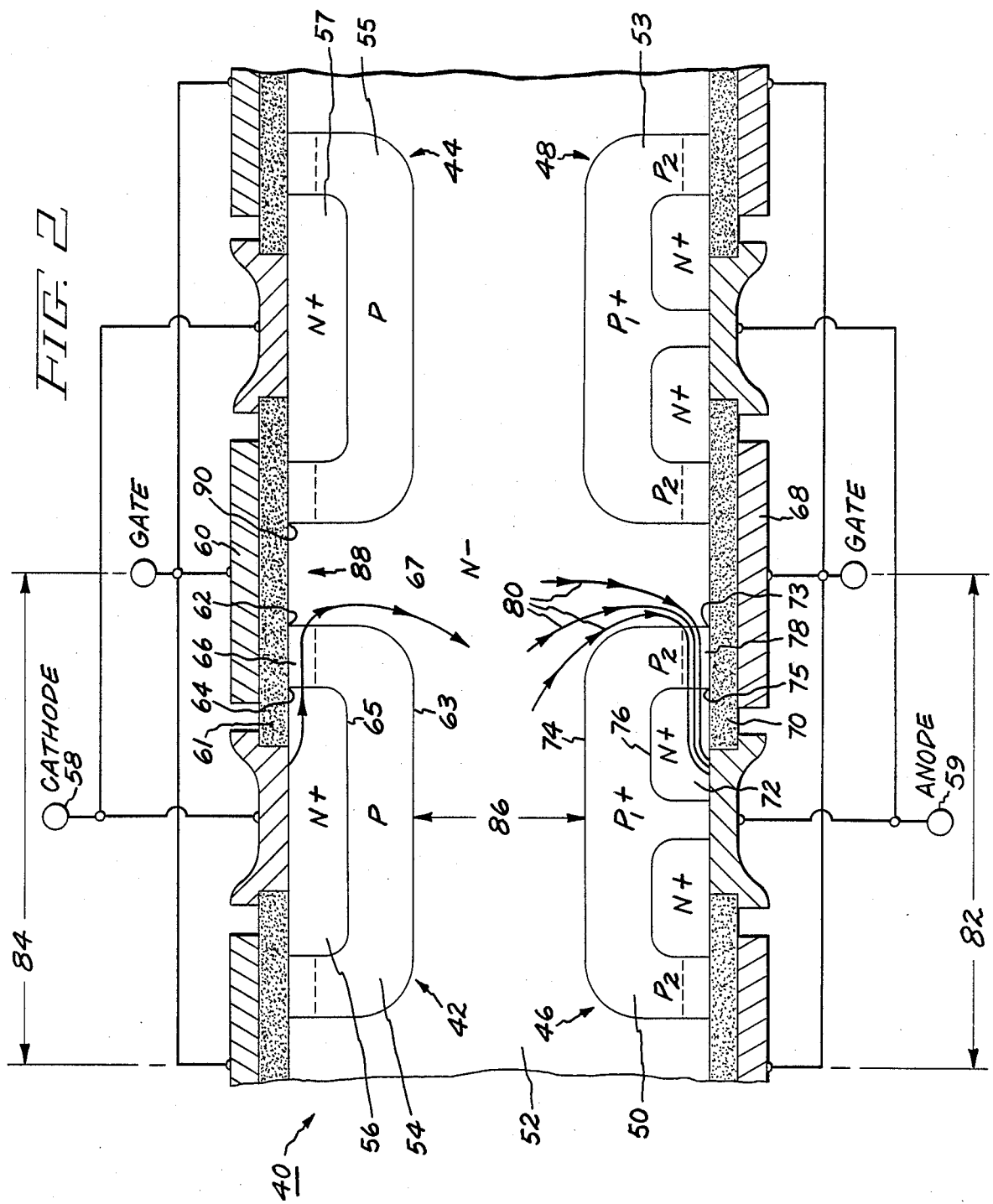
FIG. 2 is a schematic, cross-sectional, view of a semiconductor structure incorporating the invention.

FIG. 2 schematically illustrates a semiconductor device 40 incorporating the present invention. The device 40 includes turn-on cells 42 and 44, which are suitably alike, and further includes turn-off cells 46 and 48, which are suitably alike. Accordingly, only the left-hand cells 42 and 46 are discussed in detail below.

The semiconductor device 40 includes a first region 50, a second region 52, a third region 54, and a fourth region 56, which are successively joined together. The first region 50 is separated from the third and fourth regions 54 and 56 by the second region 52, and the fourth region 56 is separated from the first and second regions 50 and 52 by the third region 54. The device 40 includes further first regions, such as first region 53 of the turn-off cell 48, further third regions, such as the third region 55 of the turn-on cell 44, and further fourth regions, such as the fourth region 57 of the turn-on cell 44. It is permissible that the first region, such as 50 and 53, be interconnected; it is likewise permissible that the third regions, such as 54 and 55, be interconnected.

An N-P-N transistor structure is formed by the N-type second region 52, the P-type third region 54, and the N-type fourth region 56. A P-N-P transistor structure is formed by the P-type first region 50, the N-type second region 52, and the P-type third region 54.

Typical doping concentrations (that is, the number of dopant atoms per cubic centimeter) for the various regions of the semiconductor device 40 are in the order of the following numbers:

First region 50 ($P_1$+portion): $10^{18}$ or above
Second region 52: $10^{16}$ or below
Third region 54: $10^{17}$ or below
Fourth region 54: $10^{18}$ or above.

In can thus be said, for example, that the third region 54 has a doping concentration substantially higher than the doping concentration of the second region 52. By "substantially higher" or "substantially lower" is meant herein: higher or lower by at least about an order of magnitude.

A cathode 58, which is suitably interdigitated on the upper surface of the device 40, adjoins the fourth region 56. An anode 59, which is suitably interdigitated on the lower surface of the device 40, adjoins the first region 50.

Figure 1:
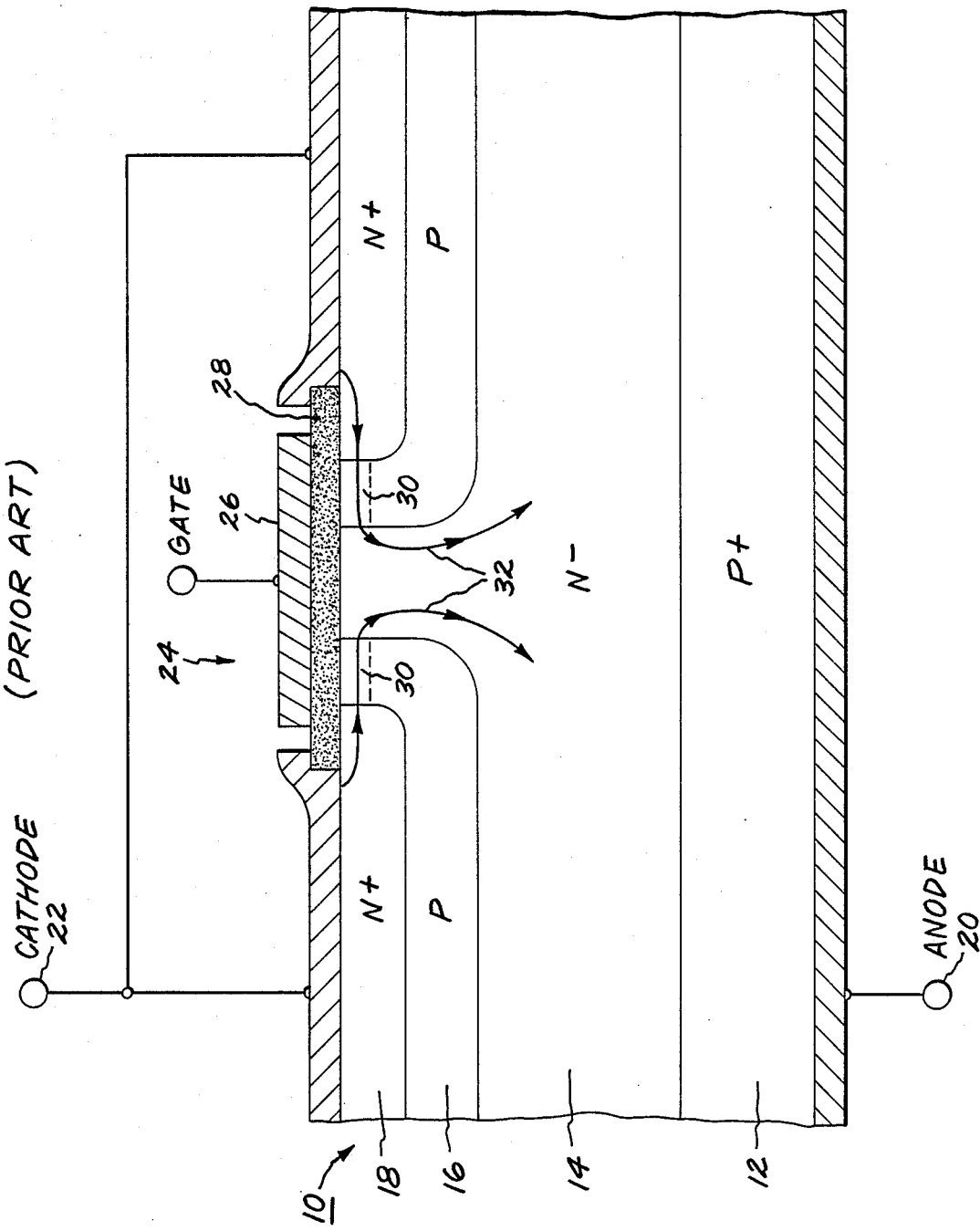
FIG. 1 is a schematic, cross-sectional, view of a prior art thyristor illustrating MOS turn-on structure on its upper surface.

The turn-on cell 42 includes a gate 60 and an insulating layer 61 separating the gate 60 from the semiconductor body of the device 40. The gate 60 overlies the third region 54 from proximate location 62 where a junction 63 (between the second and third regions 52 and 54) terminates adjacent the insulating layer 61 to proximate a location 64 where a junction 65 (between the third and fourth regions 54 and 56) terminates adjacent the insulating layer 61. Similar to the operation of the prior art turn-on structure 24 of FIG. 1, the biasing of the gate 60 with a positive voltage (with respect to the cathode 58) exceeding a threshold value inverts the P-type third region 54 immediately beneath the insulating layer 61, thereby creating an inversion channel 66, which can conduct electrons. The inversion channel 66 thus provides an electron current path 67 between the fourth region 56 and the second region 52. Electrons from the cathode 58 can thus flow in the path 67 to the N-type second region 52, which constitutes the base of the P-N-P transistor structure, and cause both the P-N-P and N-P-N transistor structures to regeneratively turn on, whereby the device 40 turns on.

The gate 60, the insulating layer 61, and the portion of the third region 54 containing the inversion channel 66 constitute what one skilled in the art would recognize as an MOS-type means for transporting majority carriers between the fourth region 56 and the second region 52, which means is of the normally-off type.

The turn-on cell 42 may be fabricated in a variety of shapes as viewed from above, such as elongated, square, or round.

The turn-off cell 46 comprises a gate 68, an insulating layer 70 and preferably, an N-type region 72. The region 72 adjoins the first region 50 and the anode 59. The gate 68 is separated from the semiconductor body of the device 40 by the insulating layer 70. The gate 68 overlies the first region 50 from a location 73 where a junction 74 (between the first and second regions 50 and 52) terminates adjacent the insulating layer 70 and a location 75 where a junction 76 (between the first region 50 and the further region 72) terminates adjacent the insulating layer 70.

Upon biasing of the gate 68 with a positive voltage (with respect to the cathode 58) exceeding a threshold value, a portion of the first region 50 immediately adjacent the insulating layer 70 becomes inverted, thereby creating an inversion channel 78, which can conduct electrons. Accordingly, electrons from the second region 52 can flow in a distributed, electron current path 80 through the inversion channel 78 and further region 72, to the anode 59.

In order for the turn-off cell 46 to properly function, the electrical resistance of the electron current path 80 must be below a value that limits forward biasing of the junction 63 due to electron flow in the current path 80, to no more than about one-half of the energy bandgap voltage of the semiconductor material forming the junction 63. This enables the device 40 to turn off, inasmuch as it removes the base drive from the P-N-P transistor structure, which in turn causes the N-P-N transistor structure to turn off. In general, the lower the resistance of the current path 80, the more current that the turn-off cell 46 can turn off. Thus, an appropriate value of resistance of the current path 80 depends in part on how much current the turn-off cell 46 is required to turn off.

The value of resistance of the electron current path 80 depends in part on the resistance of the inversion channel 78. The channel 78 resistance can be reduced by doping the $P_2$ portion of the first region 50, which contains the inversion channel, to a concentration below about $10^{17}$ dopant atoms per cubic centimeter. Additionally, the following design considerations contribute towards reducing the value of resistance of the current path 80:

(1) The overall length of the current path 80 can be reduced by reducing the horizontal dimension of the first region 50, as viewed in FIG. 2;

(2) The overall length of the current path 80 can also be reduced by reducing the horizontal dimension of the inversion channel 78, as viewed in FIG. 2;

(3) The resistance of the inversion channel 78 can be redcued by increasing the dimension of the channel 78 normal to the view of FIG. 2 in relation to the area of the cell 46, such as by reducing the size of the cell 46 by reducing dimension 82, and, additionally, by configuring the cell 46 round or square, as opposed to elongated, as viewed from below in FIG. 2; and (4) The resistance of the first region 50 and further region 72 can be reduced by doping these regions to high concentrations; however, the doping concentration of the region 50 should not be too high lest the forward drop of the device 40 becomes excessive.

In view of the present description, those skilled in the art will be able to implement semiconductor devices 40 having appropriate values of resistance of the electron current path 80 for enabling power functioning of the turn-off cell 46.

It will be recognized by those skilled in the art that the gate 68, the insulating layer 70, and the portion of the first region 50 containing the inversion channel 78, constitute an MOS-type structure for transporting electrons between the second region 52 and the anode 59 (via the further region 72), and is of the normally-off type.

The semiconductor device 40 can have two modes of operation, one as a thyristor, and the other as an FET, providing that the cell repeat distances (or cell widths) 82 and 84 of the turn-off cell 46 and the turn-on cell 42, respectively, are each about equal to or less than the minimum thickness 86 of the N-type region 52. Accordingly, an electron current path in the device 40 (not illustrated) between the cathode 58 and the anode 59, via the inversion channels 66 and 78 and the N-type second region 52 (hereinafter, "FET current path"), has a sufficiently high conductivity to enable significant electron current flow between the cathode 58 and the anode 59. Further, it is desirable that the turn-on cell 42 be aligned with the turn-off cell 46, with respect to the second region 52, as illustrated, to maximize the conductivity of the FET current path in the second region 52, for example, between the inversion channels 66 and 78. Additionally, it is desirable tha the insulating layer 61 be overlain by the gate 60 and adjoin the second region 52, as in region 88, between locations 62 and 90, for a distance which is between about 10 and 50 percent of the cell repeat distance 84 of the cell 42, with 20 percent being the most preferred value. This minimizes the spreading resistance of the FET current path through the second region 52. It is not necessary that the foregoing distance between locations 62 and 90 be along a straight path. Prior art MOS-type turn-on thyristor structures have been fabricated with distances falling within the foregoing range, per se.

As will be understood by those in the art, with the gates 60 and 68 biased with positive voltages above their respective threshold values (thus creating the inversion channels 66 and 78), varying the magnitude of either or both of the voltages on the gates 60 and 68 will vary the conductivity of the FET current path from a minimum value, which is predominantly determined by the resistance of the second region 52 (except in a low voltage device 40), up to essentially infinity. While operating in the FET mode, the semiconductor device 40 can conduct current between the cathode 58 and anode 59 in either direction, as opposed to only one direction (i.e., with the anode 59 biased positive with respect to the cathode 58) as is the case when the device 40 operates as a thyristor.

Referring to FIG. 3, there is shown a graph of device current versus time, illustrating various possible features of turning-on and turning-off the semiconductor device 40 of FIG. 2 in a bimodal fashion involving both thyristor and FET modes of operation. To simplify discussion of FIG. 3, the following definitions will be used:

(1) "FET mode" means both gates 60 and 68 are biased above their respective threshold voltages (that is, both inversion channels 66 and 78 are present);

(2) "Thyristor turn-on mode" means that only the gate 60 is biased above its threshold voltage (inversion channel 66 present); and (3) "Thyristor turn-off mode" means only the gate 68 is biased above its threshold voltage (inversion channel 78 present).

Turn-on of the semiconductor device 40 may proceed in three stages. In the first stage during time period $t_1$, with the device 40 in the FET mode, the device 40 current rises to a maximum FET current value determined by the resistance of the FET current path, which can be varied, as discussed above, by varying the magnitude of either or both of the voltages on the gates 60 and 68. The time period $t_1$, may be very short inasmuch as the device 40 acts as a majority carrier device in the FET mode. In the second stage during time period $t_2$, the device 40 is maintained in the FET mode; however, this stage may be deleted if desired. In the third stage during time period $t_3$, the device 40 is in the thyristor turn-on mode. In this mode the device 40 current is initially low during a delay time and then rises rapidly during a rise time. The device 40 current attains a maximum device current value in its thyristor turned-on condition which depends largely upon the conditions of the external circuit (not shown) in which the device 40 is connected.

Turn-off of the device 40 may proceed in three stages. The first stage occurs during time periods $t_4$ and $t_5$. The length of the time period $t_4$ can be adjusted by varying the magnitude of the voltage on the gate 68. At the beginning of time period $t_5$, the N-P-N and P-N-P transistor structures of the device 40 no longer operate in a regenerative fashion, and the device 40 current falls quickly during a fall time and then tapers off while the holes in the device 40 are being substantially eliminated, such as by recombining with electrons in the second region 52. In the second stage of turn-off during time period $t_6$, the device 40 is maintained in the FET mode; however, this stage may be deleted if desired. In the third stage during time period $t_7$, the device 40 is operated in the thyristor turn-off mode and the device 40 current falls rapidly to zero because it acts as a majority carrier device when in the FET mode.

One very important advantage of turning-off the device 40 in a bimodal fashion (both FET and thyristor operation) is that it relaxes a design constraint on turn-off cells, such as 50. This design constraint requires that each of the turn-off cells be nearly identical to the other so that each one turns off the same amount of current at the same time during the thyristor turn-off mode. If one turn-off cell were to operate later than the other turn-off cells, it would carry more current at a higher voltage and could overheat and be destroyed.

With the device 40 operating in the FET mode during turn-off, all of its FET current paths (not illustrated) assuredly carry electron current and the foregoing problem is not present. With the device 40 next operating in the thyristor mode, its turn-off cells would need to turn off a significantly reduced current, thereby greatly ameliorating the foregoing problem. If the device 40 initially operates in the FET mode (during turn-off) for a period of time sufficient to allow the holes in the device 40 to be substantially eliminated, its turn-off cells would assuredly turn off the electron current in the device 40 at essentially the same time, and the foregoing problem is not present.

Additionally, turning on and turning off the device 40 in the bimodal fashion (just described) is especially useful in certain current switching applications. This is because the device 40 can be turned on or turned off in a more gradual or controlled manner, as opposed to prior art thyristor turn-on and turn-off which is accompanied by abrupt changes in device current whenever the N-P-N and P-N-P transistor structures of the thyristor commence regenerative operation (during turn-on) or terminate regenerative action (during turn-off). Accordingly, the voltage transients generated across the device 40 during turn-on or turn-off in the bimodal fashion are significantly reduced. This reduces the need for expensive noise filters or snubbers.

In fabricating the semiconductor device 40, the first through third regions, for example, regions 50, 52, and 54, are suitably produced using conventional techniques for making thyristors where the junctions 63 and 74 comprise the main voltage blocking junctions of the device 40. The gates 60 and 68 and their associated insulating layers, as well as the further region 72, are suitably fabricated using conventional techniques for making FET's. The fourth region, for example, region 56, is suitably fabricated using either thyristor or FET techniques.

In the best mode contemplated for practising the invention, the semiconductor device 40 includes an electrical short (not shown) between the cathode 58 and the third region 54, which constitutes the base of the N-P-N transistor structure. Such a short reduces the sensitivity of the device 40 to turn-on due to noise or thermal currents in its semiconductor body, and also increases the turn-off speed of the device 40. This is because the short diverts part of the hole current base drive of the N-P-N transistor structure and directs it to the cathode 58 where it recombines with electrons from the cathode 58. This type of electrical short per se, is known in the art. Additionally, in the best mode, the semiconductor body of the device 40 comprises a silicon wafer.

Further details of turn-off cells, such as the cell 46, are described and claimed in the above-referenced patent application. Also described and claimed in such application are turn-off cells located on the upper portion of a semiconductor device, which can be incorporated in the device 40 to further increase its turn-off speed. The above-referenced patent application is hereby fully incorporated by reference.

While the invention has been described with respect to specific embodiments by way of illustration, many modifications and changes will occur to those skilled in the art. For example, complementary semiconductor devices could be made wherein the foregoing description of the invention would be applicable if P-type material were substituted for N-type material, and vice-versa, and holes substituted for electrons, and vice-versa. Additionally, while the device 40 may be fabricated by a planar diffusion process, as illustrated, other processes, involving the etching of a groove into a device semiconductor body, can equally well be used. Such a groove can have various shapes, depending upon whether a preferential etch or isotropic etch is used, and upon the crystallographic orientation of the semiconductor body. Those skilled in the art will appreciate the range of possible groove shapes. By way of example, a suitable groove shape is that of a flat-bottomed "V", as further described, for example, in V.A.K. Temple and P.V. Gray, "Theoretical Comparisons of DMOS and VMOS Structures for Voltage on On-Resistance", Reprint from International Electron Devices Meeting, December 1979, pages 88–92. Further, the second region 52 can be modified to have its portion which is in contact with the first region 50 doped to a concentration substantially higher than the concentration of the remainder of the second regio 52 (as described above), whereby the device would become what is known in the art as an asymmetrical device. It is, therefore, to be understood that the appended claims are intended to cover the foregoing and all such modifications and changes as fall within the true spirit and scope of the invention.

What is claimed as my invention and desired to be secured by Letters Patent of the United States is:

1. A latching semiconductor device providing insulated gate control over turn-on and turn-off comprising:
   a wafer of semiconductor material having first and second major surfaces and including first, second, third and fourth regions successively joined together, said first and third regions being of one conductivity type and being spaced apart by said second region, said second and fourth regions being of an opposite conductivity type and being spaced apart by said third region, a fifth region of said opposite conductivity type extending into said first region and being spaced from said second region;
   said second region extending to both said first major surface and said second major surface;
   said first and fifth regions extending to said first major surface and being spaced from said second major surface by said second region;
   said third and fourth regions extending to said second major surface and being spaced from said first major surface by said second region;
   said first region including a first channel region adjacent said first surface between said fifth region and said second region;
   said third region including a second channel region adjacent said second surface between said fourth region and said second region;
   a first main electrode disposed over said first major surface in ohmic contact with said first and fifth regions;
   a second main electrode disposed over said second major surface in ohmic contact with said fourth region and being electrically insulated from said third region;
   when said device has a bias applied across said first and second main electrodes and is conducting in a latched state in a first polarity, said first channel region, when rendered conductive, serving to turn said device off;
   a first insulated gate electrode disposed on said first major surface over said first channel region to control conduction between said fifth and second regions through said first channel region; and
   a second insulated gate electrode disposed on said second major surface over said second channel region to control conduction between said second and fourth regions through said second channel region.

2. An insulated gate turn-off latching semiconductor device comprising:
   a wafer of semiconductor material having first and second major surfaces and including first, second, third and fourth regions successively joined together, said first and third regions being of one conductivity type and being spaced apart by said second region, said second and fourth regions being of an opposite conductivity type and being spaced apart by said third region, said first, third and fourth regions each comprising a plurality of spaced apart segments, a plurality of fifth region segments of said opposite conductivity type extending into said first region segments and being spaced from said second region;
   said second region extending to both said first major surface and said second major surface;
   said first and fifth region segments each extending to said first major surface and being spaced from said second major surface by said second region;
   said third and fourth region segments extending to said second major surface and being spaced from said first major surface by said second region;
   a first main electrode disposed over said first major surface in ohmic contact with said first region segments and said fifth region segments;
   a second main electrode disposed over said second major surface in ohmic contact with said fourth region segments, and being electrically insulated from said third region; and
   said device including:
      a plurality of first cells distributed along said first major surface with a first cell repeat distance measured along said first major surface of less than the minimum thickness of said second region, each of said first cells including a portion of said second region and one of said first region segments and one of said fifth region segments and comprising conductor-insulator-semiconductor type means for controlling the transport of majority carriers of said opposite type between said fifth region segment and said second region and, when said device has a bias across its first and second main electrodes and is conducting in a latched state in a first polarity, said conductor-insulator-semiconductor type means serving as a turn-off control mechanism for said device;
      a plurality of second cells distributed along said second major surface with a second cell repeat distance measured along said second major surface of less than the minimum thickness of said second region, each of said second cells including a portion of said second region and one of said third region segments and one of said fourth region segments and comprising conductor-insulator-semiconductor type means for controlling the transport of majority carriers of said opposite type between said second main electrode and said second region.

3. The semiconductor device recited in claim 1 wherein:
   said first major surface is substantially planar; and
   said first channel region is aligned directly across said wafer from said second channel region whereby a straight line perpendicular to the plane of said first major surface which passes through said first channel region also passes through the portion of said second channel region with which it is directly aligned.

4. The semiconductor device recited in claim 1 wherein said first channel region has a lower doping concentration than the rest of said first region; and
   said second channel region has a lower doping concentration than the rest of said third region.

5. The semiconductor device recited in claim 1 wherein:
   said first major surface is substantially planar; and
   said first channel region includes first and second portion disposed adjacent two opposing sides of said first region and said first region includes a central portion extending to said first surface and into contact with said first electrode between said first and second portions of said first channel region to provide a regenerative current path extending directly through said wafer between said first main electrode and said second main electrode whereby said regenerative current path is substantially perpendicular to the plane of said first major surface.

6. The semiconductor device recited in claim 5 wherein:
   said second channel region surrounds said fourth region.

7. The semiconductor device recited in claim 6 wherein said fourth region is aligned directly across said wafer from said central portion of said first region as part of said direct regenerative current path.

8. The semiconductor device recited in claim 5 wherein said central portion of said first region is aligned directly across said wafer from said fourth region as part of said direct regenerative current path.

9. The semiconductor device recited in claim 1 wherein:
   said fourth and fifth regions each comprise a plurality of separate, spaced-apart segments.

10. The semiconductor device recited in claim 9 wherein:
    said first and third regions each comprise a plurality of spaced apart portions each respectively containing one of said portions of said fifth and fourth regions.

11. The semiconductor device recited in claim 1 wherein:
    said first major surface is substantially planar;
    each of said first cells includes a first channel region;
    each of said second cells includes a second channel region; and
    each of said first channel regions is aligned directly across said wafer from one of said second channel regions whereby a straight line perpendicular to the plane of said first major surface which passes through said first channel region also passes through the portion of said second channel region with which it is aligned.

12. The semiconductor device recited in claim 11 wherein:
    said first channel region has a lower doping concentration than the rest of said first region; and
    said second channel region has a lower doping concentration than the rest of said third region.

13. The semiconductor device recited in claim 11 wherein:
    said first channel region includes first and second portions disposed adjacent two opposing sides of said first region and said first region includes a central portion extending to said first surface and into contact with said first electrode between said first and second portions of said first channel region to provide a regenerative current path extending directly through said wafer between said first main electrode and said second main electrode.

14. The semiconductor device recited in claim 13 wherein said fourth region is aligned directly across said wafer from said central portion of said first region as part of said direct regenerative current path.

15. The semiconductor device recited in claim 14 wherein said fourth region is aligned directly across said wafer from said central portion of said first region as part of said direct regenerative current path.

16. The semiconductor device recited in claim 15 wherein said central portion of said first region is aligned directly across said wafer from said fourth region as part of said direct regenerative current path.

* * * * *